United States Patent
Yoneda et al.

[11] Patent Number: 6,125,426
[45] Date of Patent: *Sep. 26, 2000

[54] ASSOCIATIVE MEMORY DEVICE

[75] Inventors: Masato Yoneda; Hiroshi Yoshizawa; Yoshihiro Ishida; Hideo Nakano, all of Chiba, Japan

[73] Assignee: Kawasaki Steel Corporation, Kobe, Japan

[*] Notice: This patent is subject to a terminal disclaimer.

[21] Appl. No.: 09/389,060

[22] Filed: Sep. 2, 1999

Related U.S. Application Data

[63] Continuation of application No. 08/951,339, Oct. 17, 1997, Pat. No. 5,987,564.
[60] Provisional application No. 60/028,712, Oct. 17, 1996.

[51] Int. Cl.[7] .................................................. G06F 7/20
[52] U.S. Cl. .................. 711/108; 711/101; 711/107; 711/117; 711/128; 365/49; 365/50
[58] Field of Search ........................... 711/101–108, 128, 711/117; 365/49, 50

[56] References Cited

U.S. PATENT DOCUMENTS

| | | | |
|---|---|---|---|
| 3,644,906 | 2/1972 | Weinberger | 365/49 |
| 3,648,254 | 3/1972 | Beausoleil | 365/49 |
| 3,913,075 | 10/1975 | Vitaliev et al. | 365/49 |
| 4,077,059 | 2/1978 | Cordi et al. | 707/202 |
| 4,084,260 | 4/1978 | Fleming et al. | 365/49 |
| 5,239,298 | 8/1993 | Wei | 341/51 |
| 5,359,697 | 10/1994 | Smith et al. | 706/1 |
| 5,438,535 | 8/1995 | Lattibeaudiere | 365/49 |
| 5,453,948 | 9/1995 | Yoneda | 365/49 |
| 5,568,416 | 10/1996 | Kawana et al. | 365/49 |
| 5,592,407 | 1/1997 | Konishi et al. | 365/49 |
| 5,734,698 | 3/1998 | Kobayashi et al. | 379/45 |
| 5,978,245 | 11/1999 | Hata et al. | 365/49 |
| 5,987,564 | 11/1999 | Yoneda et al. | 711/108 |

*Primary Examiner*—Do Hyun Yoo
*Assistant Examiner*—T. Nguyen
*Attorney, Agent, or Firm*—Oliff & Berridge, PLC

[57] ABSTRACT

An associative memory device having a high speed and good performance is provided without degrading the simple design of a peripheral circuit of a conventional associative memory. The associative memory device has an N-bit first buffer and an M-bit second buffer in which W-bit data is stored through a data input port, detection device for detecting that the W-bit data is input to the first buffer k times or to the second buffer r times, a switch for alternately switching buffers in which the W-bit data is stored, and a search control for performing a search operation for a memory region by using data in the first or second buffer. By using data in the first or second buffer, during the search operation for the memory region of the associative memory, the W-bit data for the next search operation is input to the second or first buffer.

13 Claims, 10 Drawing Sheets

ASSOCIATIVE MEMORY DEVICE

This is a Continuation of application Ser. No. 08/951,339 filed Oct. 17, 1997 now U.S. Pat. No. 5,987,564. The entire disclosure of the prior application is hereby incorporated by reference herein in its entirety.

This nonprovisional application claims the benefit of U.S. Provisional Application No. 60/028,712 filed Oct. 17, 1996.

BACKGROUND OF THE INVENTION

1. Field of the Invention

The present invention relates to an associative memory device which has a minimum interface to an external circuit and can be operated at a high speed.

2. Description of the Related Art

A conventional associative memory device of this type has developed, and has been used in port switching of packet data of a LAN (Local Area Network) in the industrial field. However, the conventional associative memory device has developed in a situation where high-speed data communication is not strongly demanded, unlike today. For this reason, the associative memory device is designed to mainly facilitate its peripheral circuit. Therefore, the associative memory device has an arrangement having only an I/O port having a width smaller than a search data width. The prior art described above will be described below.

FIG. 9 is a block diagram showing a conventional device. This conventional associative memory device has: a 16-bit I/O port 51; a 64-bit search data register 52 which receives search data input from this port; a mask register 53 for designating bits to be stored (search target) in the search data register 52 during a search operation; a memory region 50 to be searched; and a hit address register (HHA register) 54 for storing a hit address (HHA) representing a memory word 50a in the memory region 50 which coincides with the search data by the search operation, and comprises an associative memory control circuit 56 including a search control circuit 55 which automatically starts a search operation when data having a certain number of bits (48 bits in this prior art) is input from the I/O port 51 to the search data register 52, i.e., data is input to the search data register 52 three times (when data 1 to 3 in FIG. 9 are input). An address port 57 is prepared to access the registers and the like.

In this prior art, the memory word 50a constituting the memory region 50 has a 64-bit configuration. Of the 64 bits, 48 bits indicate an MAC address serving as a search target, and auxiliary data such as a port number is stored in the remaining 16 bits. This port number Pk represents a port to which a device (terminal) having the MAC address belongs.

A destination MAC address positioned at the beginning of each communication packet data is input to the associative memory device to perform a search operation. With this search operation, the address (hit address (HHA)) of a memory word hit by the search operation is stored in the hit address register 54. A port number Pk stored in the attribute data of the hit memory word 50a is read, and an output port for the packet data is determined by the port number Pk.

Access to an ordinary register such as the search data register 52, the hit address register 54, or the mask register 53 can be performed at a high speed of about 30 to 40 ns. However, with respect to access to the memory region 50 or a search operation, since the memory region 50 serving as the target is designed to have a high density, high-speed access cannot be easily performed, and an access speed of about 80 ns can be achieved at most. As a result, a search processing speed is lowered.

In this case, a general procedure of a search operation will be described below.

A) input of search data (48 bits)
B) search operation
C) hit address (HHA) read
D) incident data of hit memory read In this procedure, for the operation C) it is necessary to know only the output port number of packet data. However, only the 16-bit data does not have a sufficient arbitrary data width in many cases, and an external RAM is often used. In this case, an external RAM corresponding to the address (HHA) of the hit memory is defined, and data is generally read from the external RAM by using the address (HHA).

The outline of the timing of the operations A) to D) is shown in FIG. 10. In this timing chart, one long rectangle represents 40 ns corresponding to 1 cycle. In this example, the search data processing cycles from T0 to T8 are represented by 8 cycles. Timings T0 and T1, starting from a position below a position where T8 is indicated, represent that the next search data processing cycles continue after the above search data processing cycles.

In this case, 16-bit data is input to the search data register 52 at timings T0, T1, and T2. However, at timing T2, the moment the data is input, a search operation is executed by the search control circuit 55. The search operation accesses the memory region 50, and requires an execution time of 80 ns. Thereafter, at timing T4, a read operation from the hit address register 54 is started, and a read operation from the I/O port 51 is performed at timing T5, 40 ns after.

Next, a read operation of the incident data Pk of the hit word 50a is started at timing T5. The read operation of this data accesses the memory region 50, and requires a time of 80 ns. In this manner, the incident data of the hit word, i.e., the port number Pk, is output from the I/O port 51 at timing T7.

The I/O port 51 is also used as a write port for search data, and search data for processing the next search data cannot be written at timing T7. For this purpose, one dummy cycle is required until the next cycle is started. More specifically, a series of search data processing cycles require 8 cycles (320 ns).

On the other hand, in recent high-speed data communication, the time required to perform the series of search data processing cycles is close to 200 ns, and there is a demand that the search data processing cycles are performed at even higher speed, i.e., within 200 ns. However, as in the above prior art, a conventional associative memory device comprising only one I/O port, having a width smaller than a search data width to facilitate design for a peripheral circuit, cannot provide performance which satisfies the above demand.

SUMMARY OF THE INVENTION

It is an object of the present invention to provide an associative memory device which solves the above problems of the prior art and has a high speed and good performance without degrading the simple design of a peripheral circuit of a conventional associative memory.

In order to achieve the above object, according to the present invention, there is provided an associative memory device having: a data input port to which W-bit data is input; an N-bit (W<N) first buffer and an M-bit (M<N) second buffer in which the W-bit data input through the input port is stored; input control means for storing the W-bit data in the first or second buffer; detection means for detecting that the W-bit data is input to the first buffer k times (k×W≦N) or to the second buffer r times (r×W≦M); switching means for switching a buffer in which the W-bit data input through the input port is stored from the first or second buffer to the second or first buffer in response to a detection signal from the detection means; and search control means for performing a search operation for a memory region of an associative memory by using data in the first or second buffer, characterized in that during the search operation for the memory region of the associative memory, the W-bit data for the next search operation is input to the second or first buffer by using data in the first or second buffer.

In this case, a cycle time Ts of the search operation and a cycle time Tw for writing data to the first or second buffer preferably satisfy Tw<Ts.

A read cycle time Tr of data from the memory region of the associative memory is preferably longer than the cycle time Tw (Tw<Tr), the associative memory device preferably has holding means DH for temporarily holding data read from the memory region, and a read cycle Th of data from the holding means DH is preferably shorter than the cycle time Tr (Th<Tr).

The associative memory device preferably has automatic holding control means for automatically holding at least a part of a memory word hit in a search operation in the holding means DH when a search operation for the memory region of the associative memory is performed.

The associative memory device preferably has an output port for outputting an address of the hit word in the memory region of the associative memory obtained by the search operation and at least a part of the contents of the hit word.

DESCRIPTION OF THE PREFERRED EMBODIMENTS

An associative memory device according to the present invention will be described below on the basis of preferred embodiments shown in the accompanying drawings.

Figure 1:
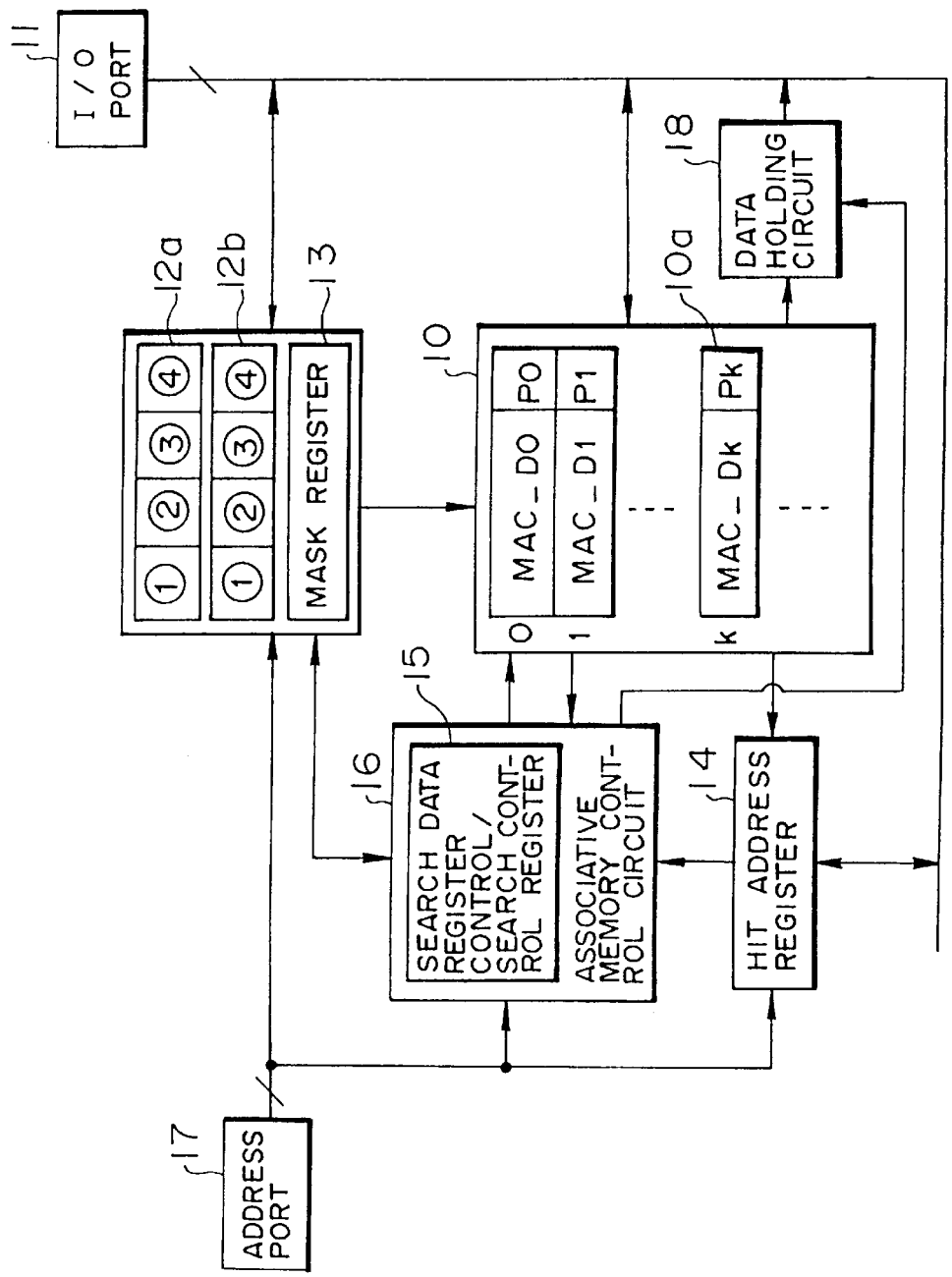
FIG. 1 is a block diagram showing an associative memory device according to an embodiment of the present invention.

FIG. 1 is a block diagram showing an associative memory device according to an embodiment of the present invention.

The associative memory device shown in FIG. 1 has a memory region 10 including a plurality of 64-bit memory words 10a serving as search targets, an I/O port 11 which receives 16-bit search data and outputs the hit address (HHA) and incident data (port number Pk) of a memory word 10a which coincides with the search data, search data registers A12a and B12b for holding the search data input from the I/O port 11, a mask register 13 for masking the bits of the search data other than bits serving as a search target, a hit address register (HHA register) 14 for storing the hit address (HHA) of the memory word 10a having data which coincides with (hits) the search data, a search data register control/search control circuit 15 for alternately controlling an input from the I/O port 11 to the search data registers A12a,B12b and controlling a search operation, an associative memory control circuit 16, including the control circuit 15, for controlling the associative memory device as a whole, an address port 17 for accessing the search data registers A12a,B12b, the hit address register 14, and the control circuit 15,16, and a data holding circuit 18 for temporarily holding data including the incident data of the memory word 10a which coincides with the search data.

Figure 9:
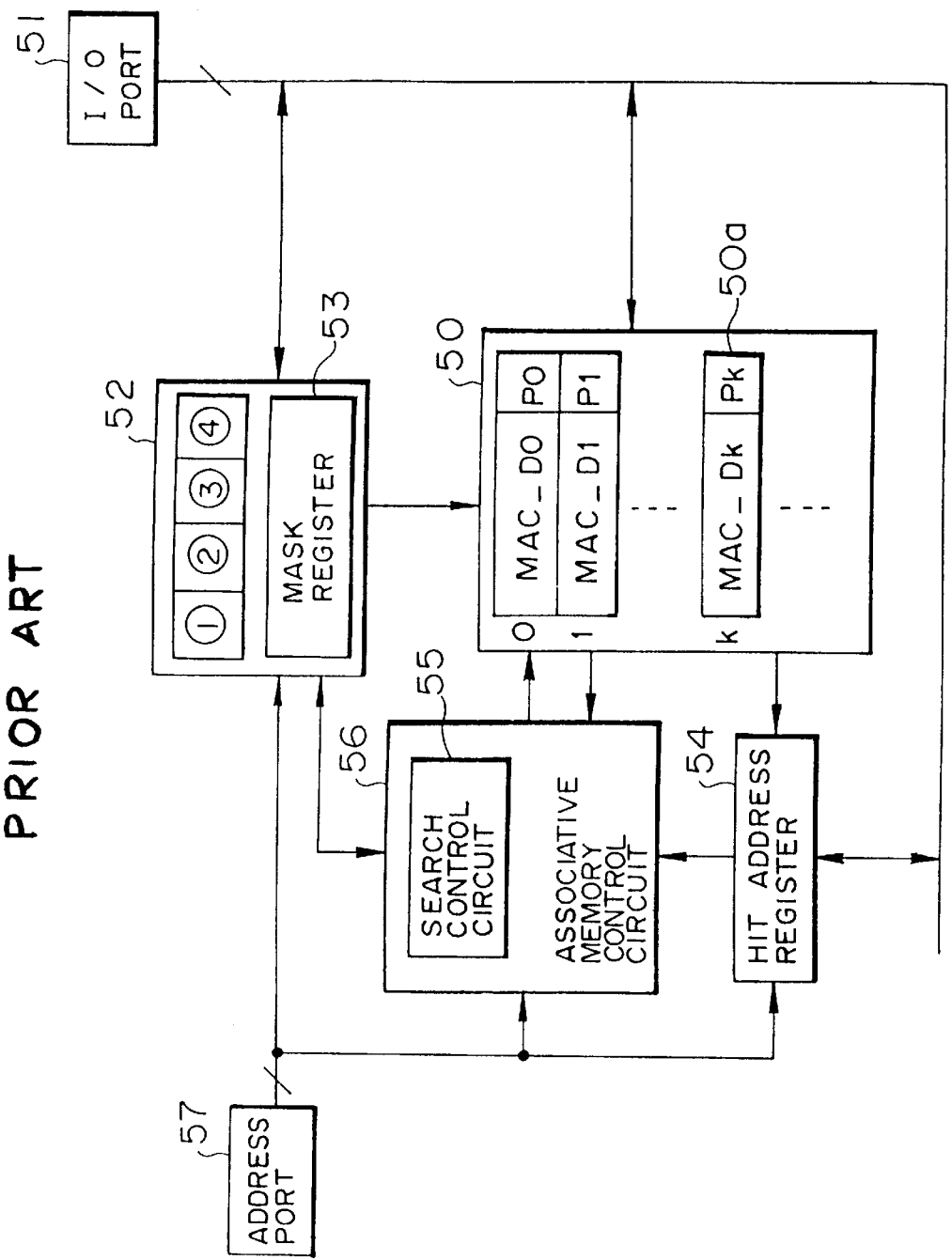
FIG. 9 is a block diagram showing a conventional associative memory device.

The associative memory device, as in the prior art shown in FIG. 9, has the 16-bit I/O port 11. MAC address data (48 bits) is input from the I/O port 11 three times, and search processing is performed. The apparatus shown in FIG. 1 is slightly similar (especially, pin count) to the conventional device shown in FIG. 9. The number of control pins required by a peripheral device for controlling the associative memory device shown in FIG. 1 is equal to that shown in FIG. 9. If both the devices are packaged on the same board, a package area required for this packaging is equal to that in the prior art.

However, the difference between the associative memory device in this embodiment, and the associative memory device of the prior art in FIG. 9, is the arrangement of two search data registers A12a,B12b. In the apparatus shown in FIG. 1, a method of operating the search data register A12a and the search data register B12b will be described below.

Each 16 bits of the 32 bits of the MAC address data (48 bits) are stored in areas 1 and 2 (FIG. 1) of the search data register A12a. This storage operation is a write operation into the register, and is performed at a high speed (1 cycle: write cycle time Tw=40 ns (see FIG. 2)).

The moment the remaining 16 bits are written in area 3 (FIG. 1) in the search data register A12a, a search operation for the memory region 10 is started by the 48-bit MAC address data stored in the search data register A12a.

At this time, as in the prior art, a specific bit of the search data register A12a is determined as a search target bit by the mask register 13. In this case, 48 bits in areas 1 to 3 of in the search data register A12a are target bits, and 16 bits in area 4 are not target bits. For this reason, '0' is defined at 48 bits corresponding to area 1 to 3 in the search data register A12a of the mask register 13, and '1' is defined as 16 bits corresponding to area 4, thereby performing mask processing.

A search operation for the memory region 10 cannot be easily performed at a high speed, and requires at least 2 cycles (search operation cycle time Ts=80 ns (see FIG. 2)). The first cycle of the two cycles is a write operation of data in area 3 in the search data register A12a. Meanwhile, the I/O port 11 is occupied by the write data. However, in the second cycle, the I/O port 11 is in an idle state.

Since the 16-bit I/O port 11 is originally employed in consideration of simplicity of design for a peripheral control circuit and a reduction in cost, data input for the MAC address (48 bits) requires 3 cycles. To obtain the maximum performance under this restriction, it cannot be helped saying that the idle state of the I/O port 11 is very uneconomical.

Therefore, when the search data register B12b serving another search data register is arranged, the 16 start bits of the next MAC address data (48 bits) can be written in area 1 in the register B12b.

When search processing of the MAC address data is continuously performed by the associative memory device of the present invention as described above, the number of data input cycles can be reduced by one if the number of bits of the MAC address data (48 bits (16×3 cycles)) are reduced to 32 bits (16×2 cycles).

Figure 2:
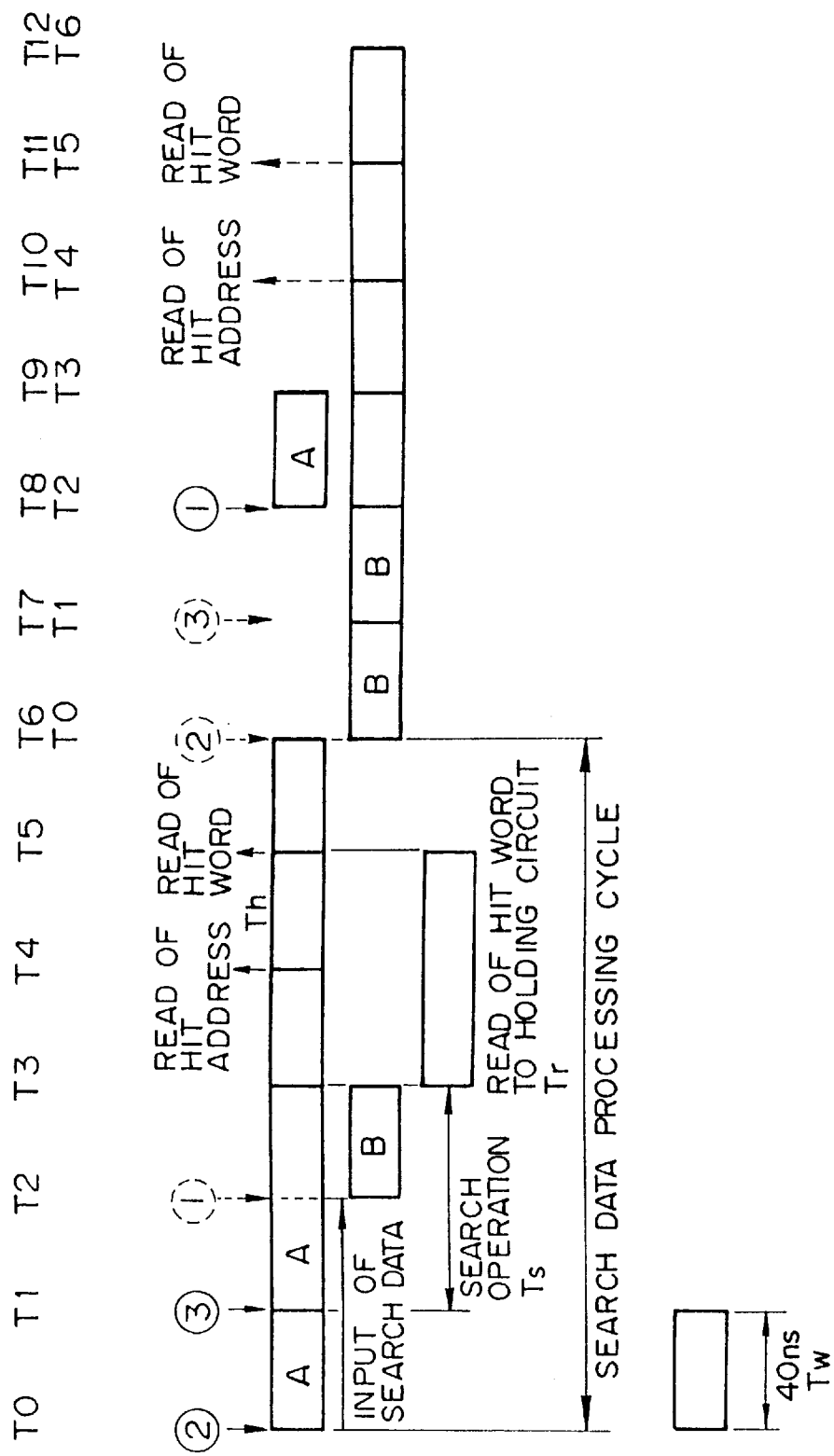
FIG. 2 is a timing chart showing the outline of search data processing cycles of the associative memory device shown in FIG. 1.

The outline of an example of this timing chart is shown in FIG. 2.

Referring to FIG. 2, data in areas 2 and 3 are input to the search data register A12a at timings T0 and T1, and a search operation is started (at timing T1). However, it is assumed that the 16 start bits of the present MAC address data have been input to area 1 (see FIG. 1) in the same register A12a in the search data processing cycles of the previous MAC address data.

The moment the search operation of the present MAC address data is started from timing T1 in FIG. 2, the 16 start bits of the next MAC address data are written in area 1 (see FIG. 1) in the search data register B12b in the next cycle.

Similarly, search processing of the next MAC address data is started from timing T6. However, the remaining 32-bit data is sequentially written in areas 2 and 3 in two cycles starting from timing T6 (T0), and, at timing T8 (T2), the 16 start bits of the next MAC address data are written in area 1 (FIG. 1) in the search data register A12a.

The search data register control/search control circuit 15 shown in FIG. 1 alternately controls the search data register A12a and the search data register B12b.

The search data register control/search control circuit 15 has at least one data write switching register (not shown), and controls the switching operation between the search data register A12a and the search data register B12b. That is, in this embodiment, the number of times of data is written from the I/O port 11 to one of the search data registers A12a,B12b is counted. When this number reaches 3, a write destination is changed to the alternate search data register A12a or B12b.

More specifically, both the search data registers A12a, B12b are toggled by the switching register. This toggle control has an initial value, and, when the associative memory device is reset, the first search data register in which the 16 bits are written is defined as, e.g., the search data register A12a.

When the initial value of the toggle control is set, two registers for defining a switching operation between a data write operation from the search data register A12a to the search data register B12b, and a data write operation from the search data register B12b to the search data register A12a, can be arranged to independently control switch timings.

In addition, in the above description, the moment a write operation of data into the search data register A12a or B12b is completed, each search operation is started. However, the timing of the search operation can be defined by another search operation timing definition register. In this case, one search operation timing definition register may be arranged for the search data registers A12a,B12b, or two search operation timing definition registers may be arranged for the search data registers A12a,B12b, respectively.

When this definition register is arranged, the following advantage can be obtained. That is, although the search data register is set to be replaced with another when 48-bit data is input, i.e., when 16-bit data is input three times, in the above example, if the number of inputs in the search operation timing definition register is set to 2, a search operation can be started when search data is input to area 2 (in FIG. 1) in the search data register A12a or B12b. The switching operation, between the search data registers A12a, B12b serving as the search data write destinations, and the search start timing, can be independently controlled.

In this manner, although it seems as if a method of arranging the two search data registers A12a and B12b is simple, this method cannot be achieved until the characteristics of the associative memory device of the present invention and a method of using the associative memory device are carefully considered. This is because the design of the registers is not complex and can be actually realized without any change in the specification of the associative memory device, however the registers are not arranged the same in a conventional associative memory device.

In this embodiment, the time of the search operation (Ts) is set to be about twice the time of a conventional register access (Tw) to simplify the description. For this reason, only one cycle can be reduced. In fact, a search operation is considerably slower than a register access operation, and preparation for the next search data can be completed by arranging the two search data registers. Therefore, the associative memory device having the new arrangement greatly contributes to high-speed communication.

Furthermore, another speed increasing technique described in this embodiment will be described below.

This technique is also devised after sufficient consideration and attention is given to the following points. That is, as in the above technique, the arrangement of a device of this type has a large-capacity memory, designed to achieve a high density rather than a high speed as the primary object, and a register group, capable of performing high-speed access. Access to both the memory and the register group must be performed in a series of search operations.

Figure 10:
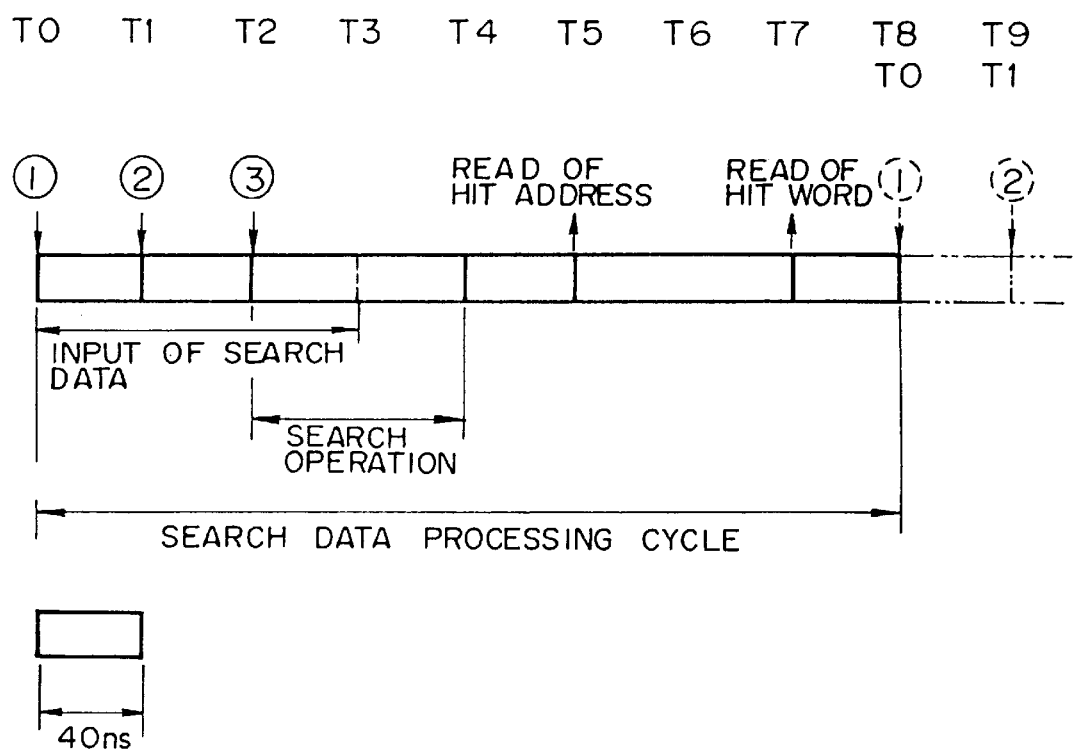
FIG. 10 is a timing chart of a search operation of the associative memory device shown in FIG. 9.

In FIG. 2 or FIG. 10 (showing the prior art), after the search operation, a hit address (HHA) is read from the hit address (HHA) register 14. As a result, this read operation accesses a register and can achieve a high-speed (1 cycle) read operation. However, a read operation of the incident data of the hit memory word 10a designated by the next hit address accesses to the memory region 10 designed to have a high density, and this read operation requires 2 cycles (read cycle time Tr=80 ns of data from the memory region) (see FIGS. 2 and 10).

However, when a procedure of reading incident data is determined subsequent to the read operation of the hit address (HHA), this procedure accesses to a different area in the register. Therefore, while the contents of the HHA register 14 are read to the I/O port 11, an operation of temporarily reading the contents of the memory region 10 to the data holding circuit 18 can be performed.

More specifically, the moment a data read operation from the HHA register 14 is performed at timing T3 in FIG. 2, a read operation of the hit word from the memory region 10 is started, and the data and the hit word are temporarily stored in the data holding circuit 18. A read operation from the data holding circuit 18 is started at timing T4. At this time, the data of a correct hit word has not been output, but the data will be output as a correct value until timing T5 (1 cycle: read cycle time Th=40 ns of data from the data holding circuit (see FIG. 2)).

In this manner, the data of the hit memory word 10a, which is read in 2 cycles in the prior art, can be handled as if the data can be read in 1 cycle.

As result, the trigger of the above operation is the read operation from the HHA register 14. When the read operation from the HHA register 14 is performed, the read operation of the hit word is not always performed and may prevent the next read operation. Therefore, when the read operation of a series of hit addresses and a read operation of memory contents are continuously performed, an address different from an address used in general access to the HHA register 14 is defined to be input from the address port 17.

According to the above devising, as shown in FIG. 2, a series of search processing cycles consists of 6 cycles, i.e., a time required to the series of search processing cycles is 6×40 ns=240 ns which is shortened by 25%, compared with 320 ns in the prior art. In addition, this increase in speed can be obtained without changing an external interface and sacrificing the simplistic design of a conventional peripheral circuit or low cost.

In the above example, it is assumed that access to a register is performed in 1 cycle, i.e., 40 ns, for descriptive convenience. However, in fact, the access can be performed at a higher speed. As described above, because the search operation is completed in the previous search cycle, a time can be actually shortened by about 1 to 2 cycles, and so that industrial values of these techniques are very high.

In order to support the technical value, a high-speed edition in the prior art will be briefly described below.

In the prior art, the number of external interface pins is reduced, and a 16-bit I/O port is used to facilitate the design for a peripheral control device and reduce cost as the main objects. However, the conventional device must be improved in response to the request of an increase in speed of the search data processing cycle, and use of a 32-bit I/O port is proposed to achieve a high-speed operation.

More specifically, it is proposed that 3 cycles required to input 48-bit MAC address data in FIG. 10 are reduced to 2 cycles. With this improvement, the time (320 ns (40 ns×8)) required for a series of search data processing cycles is shortened to 280 ns (40 ns×7). For this reason, the number of external interface pins is increased by 16 (16 bits), thereby increasing the cost of the peripheral control device.

However, in the first embodiment of the present invention, the increase of external interface pins in number is suppressed to '0', i.e., is eliminated, and 240 ns (40 ns×6) is realized. Therefore, the first embodiment clearly shows the excellent points of the present invention.

The present invention makes another proposal to increase speed here. This is because it is recognized that better performance can be obtained when the external interface is changed as in the second prior art described above.

Figure 3:
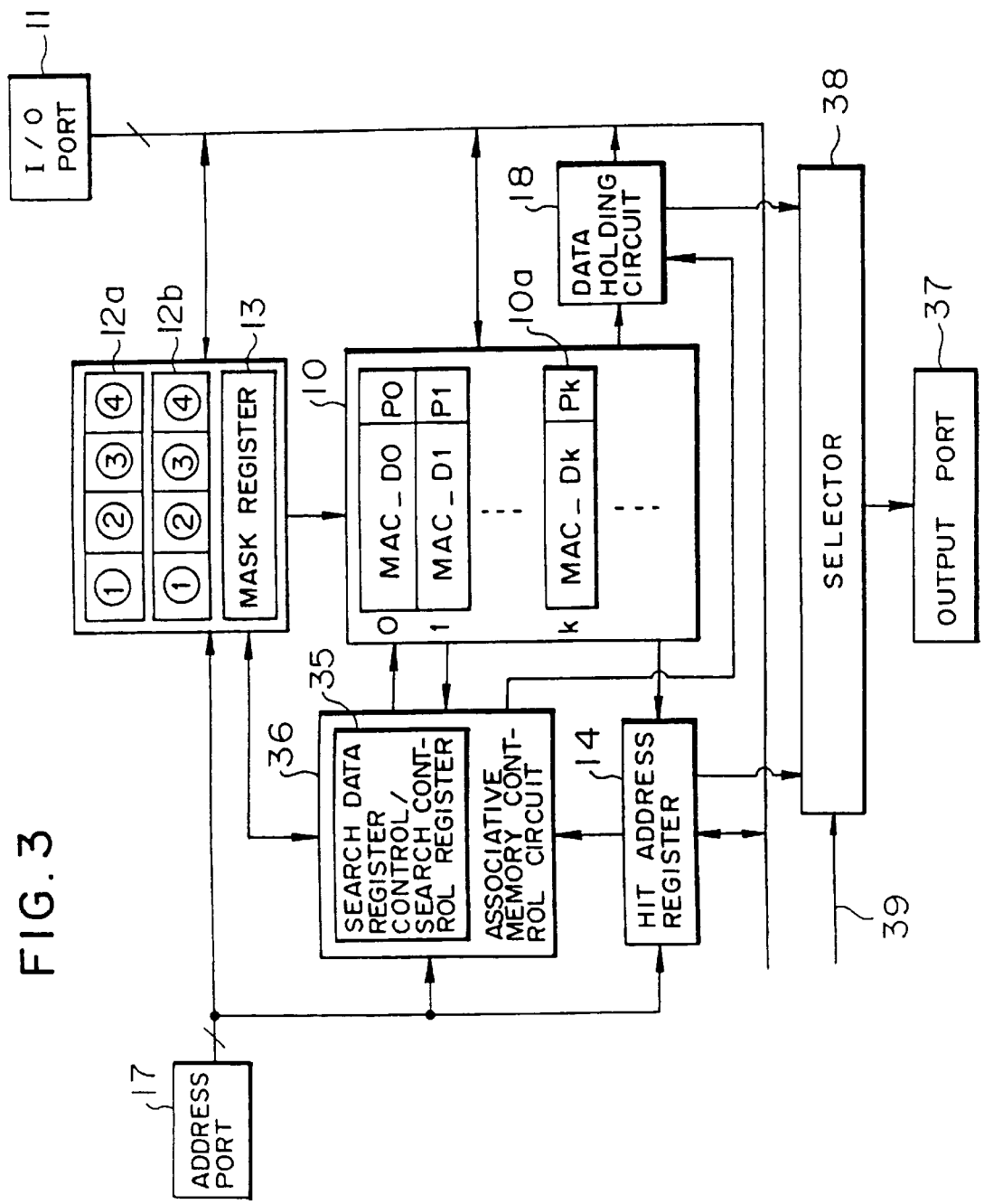
FIG. 3 is a block diagram showing an associative memory device according to another embodiment of the present invention.

FIG. 3 is a block diagram showing an associative memory device according to the second embodiment of the present invention.

The associative memory device shown in FIG. 3 is different from the associative memory device shown in FIG. 1 in that outputs from the data holding circuit 18 and the HHA register 14 are output from an output port 37 through a selector 38.

This output port 37 has, for example, a 16-bit configuration. A select signal 39 is set to select an output from the output port 37.

More specifically, although external interface pins are increased in number by a number almost equal to the number of external interface pins increased when the number of bits of a conventional I/O port 11 (16 bits) is increased to 32, the performance of the device in this embodiment is much better than that in the conventional device.

Figure 4:
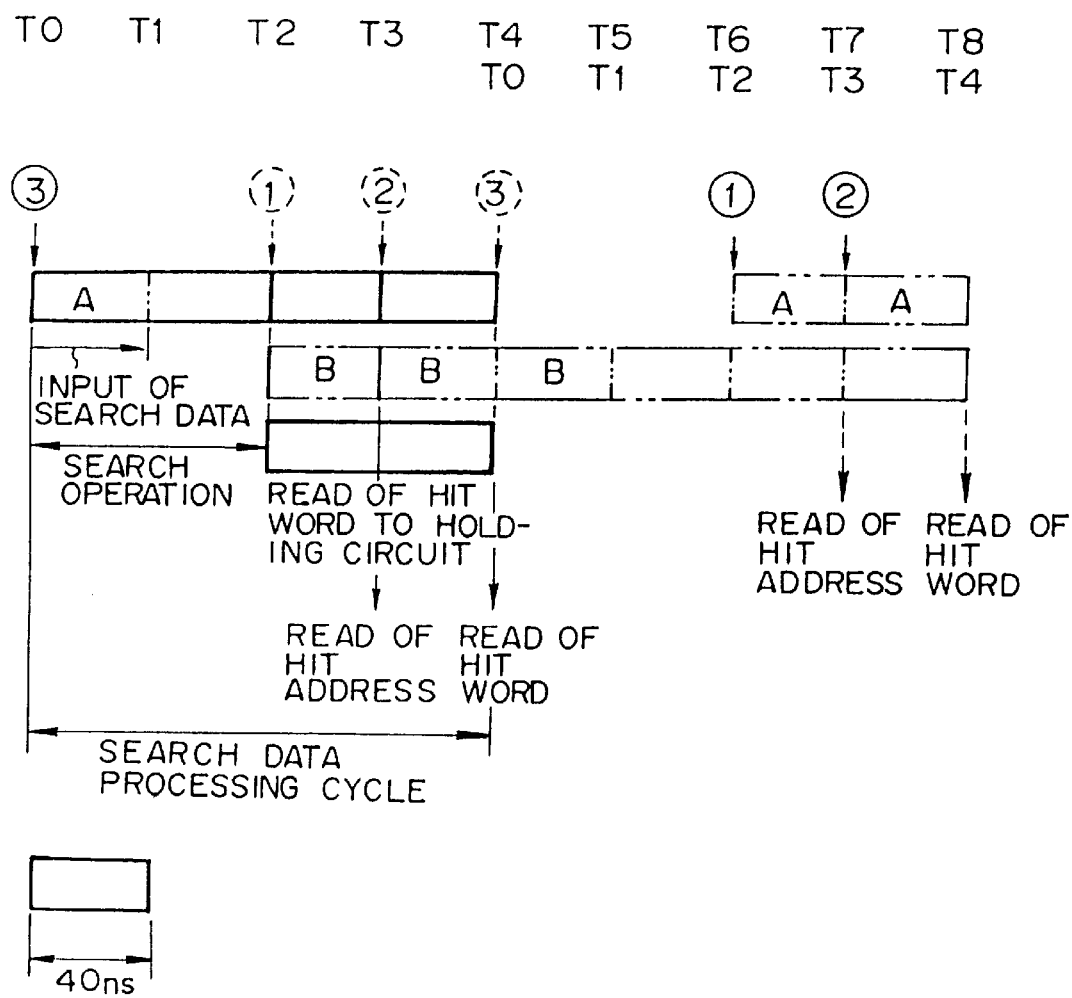
FIG. 4 is a timing chart showing the outline of search data processing cycles of the associative memory device shown in FIG. 3.

FIG. 4 is a timing chart of a series of search data processing cycles in the associative memory device shown in FIG. 3.

By only arranging the 16-bit output port 37, search data can be very easily input. More specifically, as shown in FIG. 2, when the output port 37 is used in a read operation of a hit address (HHA) performed between timing T3 and timing T4, or a read operation of incident data from the hit word performed between timing T4 and timing T5, the I/O port 11 is not occupied. MAC address data serving as the next search target can be partially stored in the search data register A12a or B12b.

At timings T2 and T3 in a timing chart shown in FIG. 4, 32 bits (16 bits×2) of the MAC address data serving as the next search target are input to the search data register B12b. More specifically, the next search operation is started at timing T4 (T0) at which the remaining 16 bits of the MAC address data are input to the search data register B12b.

Similarly, in this timing chart, a description will be performed on the assumption that 32 bits (16 bits×2) of MAC address data serving as a present search target have been input, and that the search operation is started the moment the last 16 bits are input to the search data register A12a at timing T0.

The search operation is started at timing T0, and a hit address is read from the HHA register 14 at timing T2. At the same time, as in the first embodiment, the contents of the memory word 10a are read. The contents are output to the output port 37 at timing T4.

In the prior art or the first embodiment of the present invention, a dummy cycle must be inserted after timing T4 before the next search data processing cycle is started to prevent the data obtained by reading the contents of the hit word and data for the next search operation from competing with each other. As in the second embodiment, since the output port 37 for reading the contents of the hit word and the I/O port 11 for writing the data for the next search operation are different from each other, no dummy cycle is required.

As a result, in this embodiment, astonishingly, a series of search data processing cycles require 4 cycles, i.e., a time of 160 ns (40 ns×4), which is ½ the time of 320 ns in the prior art shown in FIG. 9. Therefore, the speed of the series of search data processing cycles in this embodiment is twice that of the series of search data processing cycles in the prior art.

When the 4 cycles are compared with 7 cycles, i.e., 280 ns, of a series of search data processing cycles in a conventional high-speed edition having a 32-bit I/O port, the speed in this embodiment is 1.75 times that in the high-speed edition. When the 4 cycles are compared with 6 cycles of a series of search data processing cycles in the first embodiment of the present invention, the speed in this embodiment is 1.5 times that in the first embodiment.

This value sufficiently satisfies user's request that the device should be used in high-speed data communication, i.e., 200 ns.

More specifically, although the device of this embodiment has an external interface which is almost the same as that of a device having a 32-bit I/O port and obtained by improving a conventional device, the device of this embodiment performs much better than that of the improved conventional device. The device of this embodiment cannot be obtained until innovations are performed in consideration of communication methods and characteristics. The industrial value of the device is very important for high-speed data communication in the future. The device can be used as an associative memory device having high performance and low cost.

The above embodiment describes a case wherein, after a search operation, in order to acquire incident data such as a port number, or the like, corresponding to a MAC address located at the beginning of the packet data, incident data, such as a port number or the like, stored in the memory word 10a at a hit address is read.

The following embodiment will describe a case wherein, after a search operation, in order to always update incident data into the latest information, incident data stored in the memory word 10a at a hit address is rewritten.

For example, using the associative memory device according to the present invention, a switching machine such as personal computers (to be referred to as PCs hereinafter) are connected to respective ports to be used for acquiring incident data, such as a port number or the like, corresponding to an MAC address, located at the beginning of the packet data.

Here, when a port, to which a certain PC is connected, is changed from port 1 to port 3, unless a port number included in incident data of the memory word 10a, in which data at the MAC address corresponding to the PC is stored, is updated from port 1 to port 3, the packet data to be transferred to the PC is transferred to port 1, which is not connected to the PC. In order to prevent this, the port number of the port to which each PC must be always updated, is read into the latest information.

The number of words of the memory word 10a is generally smaller than the number of all PCs on a network, the information of a specific PC is selectively stored in each memory word 10a. In order to improve the efficiency of the associative memory device, for example, time stamp information is always updated to register only the information of a frequently used PC in the memory word 10a. Therefore, the time stamp information of each memory word 10a must be always updated to have the latest information.

In this manner, under the general use condition of the associative memory device, after a search operation, reading of incident data from the memory word 10a at a hit address, or writing of incident data updated for the memory word 10a at the hit address, is performed as a series of operations, and the series of operations are continuously repeated.

Figure 5:
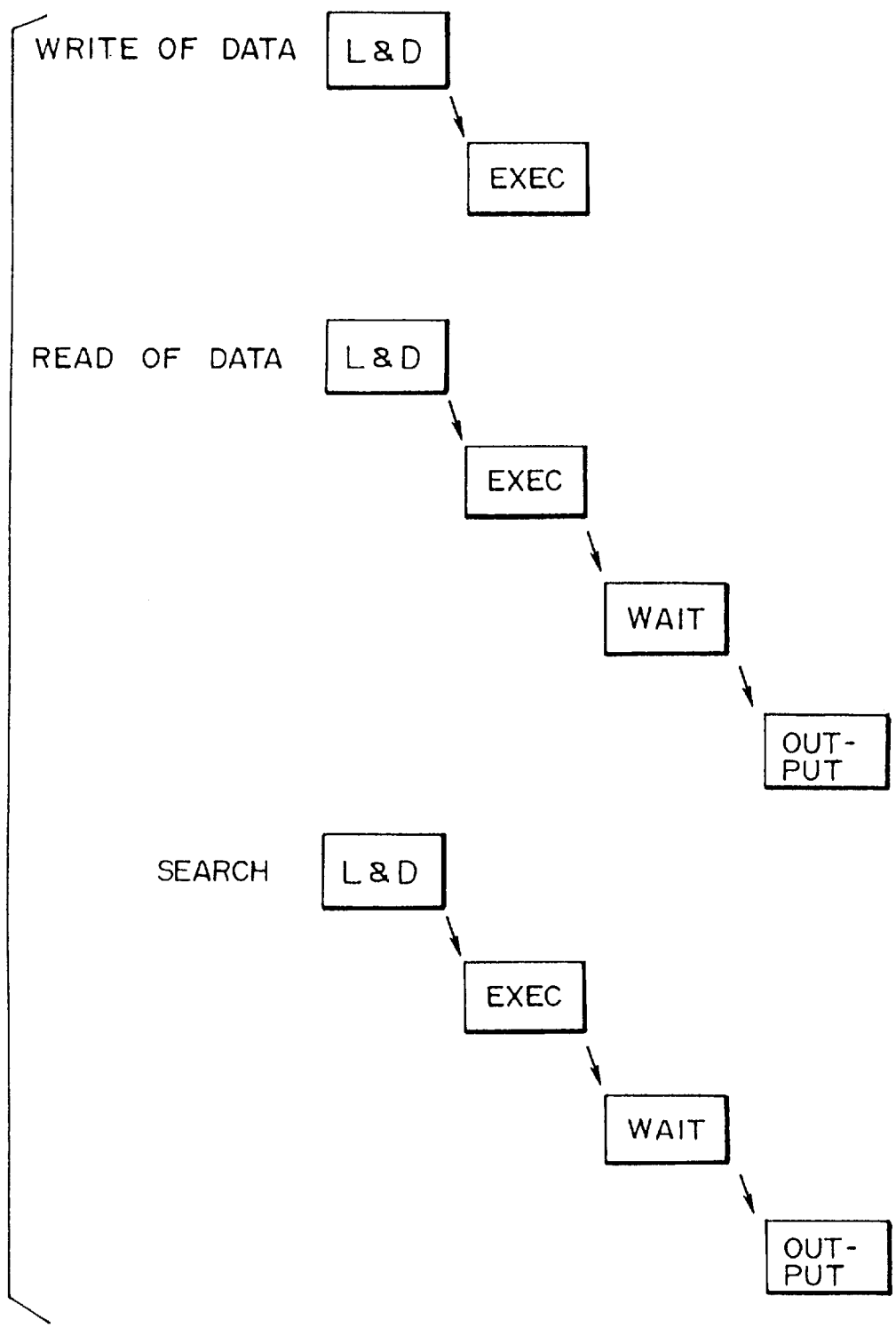
FIG. 5 is an illustration of write, read, and search processing cycles in the associative memory device according to the present invention.

FIG. 5 illustrates write, read, and search processing cycles in the associative memory device according to the present invention. As shown in FIG. 5, incident data is written in the memory word 10a at a hit address in the following manner. First, when an external address is latched and decoded in an L & D (Latch & Decode) phase, and an external request at this time is data write, the external address indicates a hit memory word to confirm that the external data is data write. Thereafter, in an EXEC (Execution) phase, the incident data is written in the memory word 10a designated by the hit address. As the write data used at this time, data latched in the L & D phase and input from an external circuit is used.

Incident data is read in the following manner. As described above, in the L & D phase, an externally given address indicates a hit memory word, and a request at this time is data read. In this case, incident data such as a port number or a time stamp is read from the memory word 10a designated by the hit address in the EXEC phase, the incident data read from the memory word 10a is latched by the data holding circuit 18 in a WAIT phase, and the incident data latched by the data holding circuit 18 is output from the output port 37 in an OUTPUT phase.

Search of the data is performed in the following manner. That is, an address input from the address port 17 is latched and decoded to interpret the address indicating search in the L & D phase. Search data of the search data register A12a or B12b designated by a part of the decoded address is then compared with the MAC address data of each memory word 10a in the EXEC phase. A hit address is latched by the HHA register 14 in a WAIT phase, and the hit address latched by the HHA register 14 is output from the output port 37.

Figure 6:
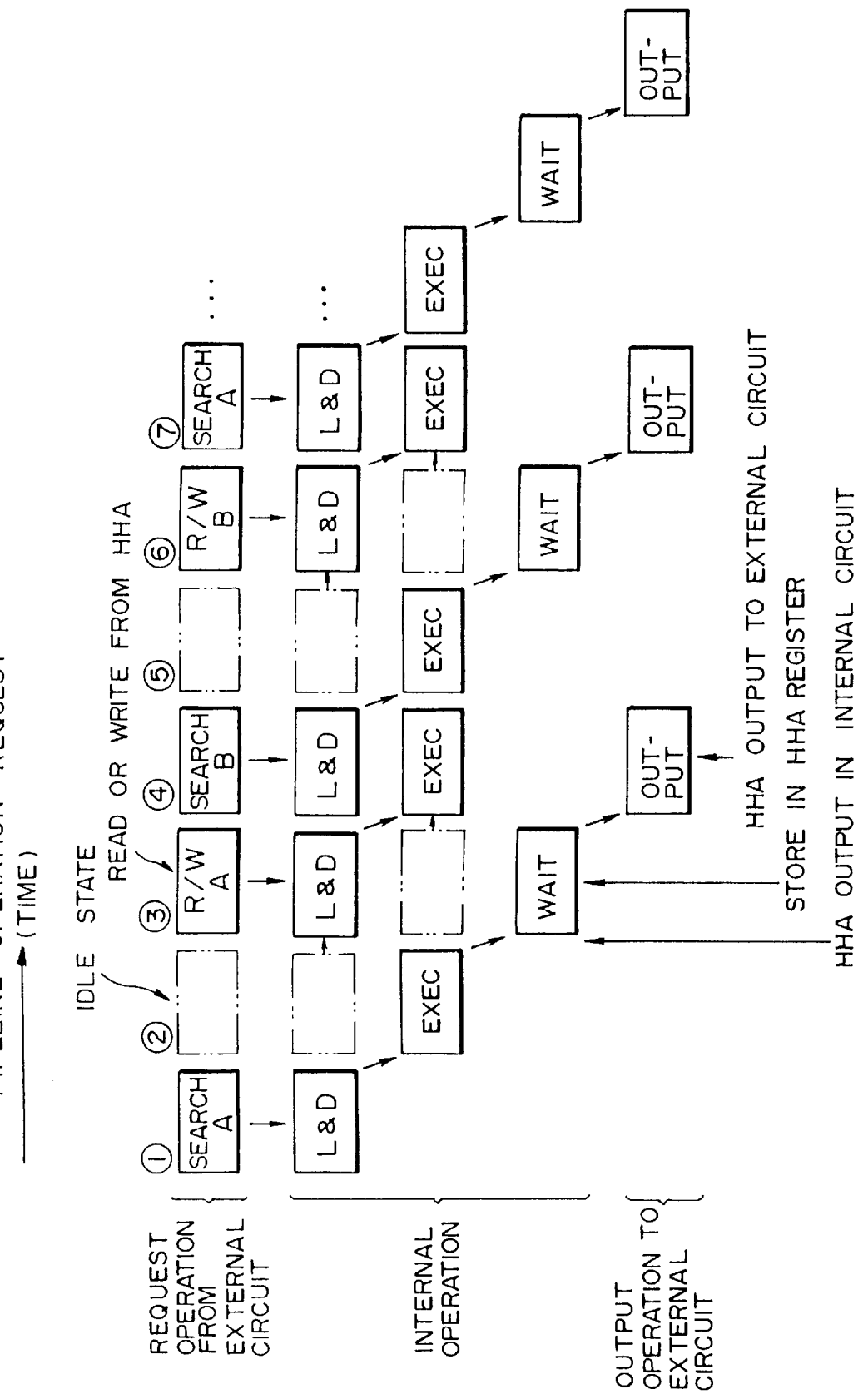
FIG. 6 is a timing chart showing other search data processing cycles in the associative memory device shown in FIG. 3.

A case wherein the series of operations are performed in a pipeline manner is shown in FIG. 6. The series of operations are performed such that the following operations are alternately performed. After search A is performed by using search data of the search data register A12a, incident data is read or written (R/W A) (read is performed in this embodiment) from/in the memory word 10a at the hit address output in search A. After search B is performed by using search data of the search data register B12b, incident data is written (R/W B) in the memory word 10a at the hit address output in search B.

As in the timing chart in FIG. 6, in search A of the first external request operation, after the EXEC phase, a hit address (HHA) is output from the memory region 10. On the other hand, when an external request for reading the incident data of the memory word 10a at the hit address (HHA) obtained in this search operation is input at the second external request operation timing in FIG. 6, the EXEC phase for executing the read operation is executed immediately after the EXEC phase for executing the first search operation, and the WAIT phase is skipped. For this reason, the reading of incident data of the memory word 10a at a correct HHA address cannot be executed.

An external read request operation is input at a third timing in FIG. 6. In this manner, as the result of the first search operation, the EXEC phase of the read operation is executed at a timing after the WAIT phase. For this reason, the read operation is executed by using a current hit address (HHA) latched by the HHA register 14. Write (R/WB) of incident data into the memory words 10a at hit addresses of the fourth search B and sixth search B of an external request operation is performed in the same manner as described above. However, in order to correctly execute an external request operation, the second or fifth idle state in FIG. 6 is required.

Therefore, with respect to efficiency of use, immediately after the search A, reading (R/WA) of the incident data is performed, and immediately after search B, writing (R/WB) of the incident data is performed. Subsequently, as a result, it is preferable that search and read/write operations of incident data are repeated in the same manner as described above. However, for the above reason, an idle-state period in which no operation is performed is inserted between search A and reading (R/WA) of incident data and between search B and writing (R/WB) of incident data. Therefore, because efficiency cannot be improved, a problem is posed.

Figure 7:
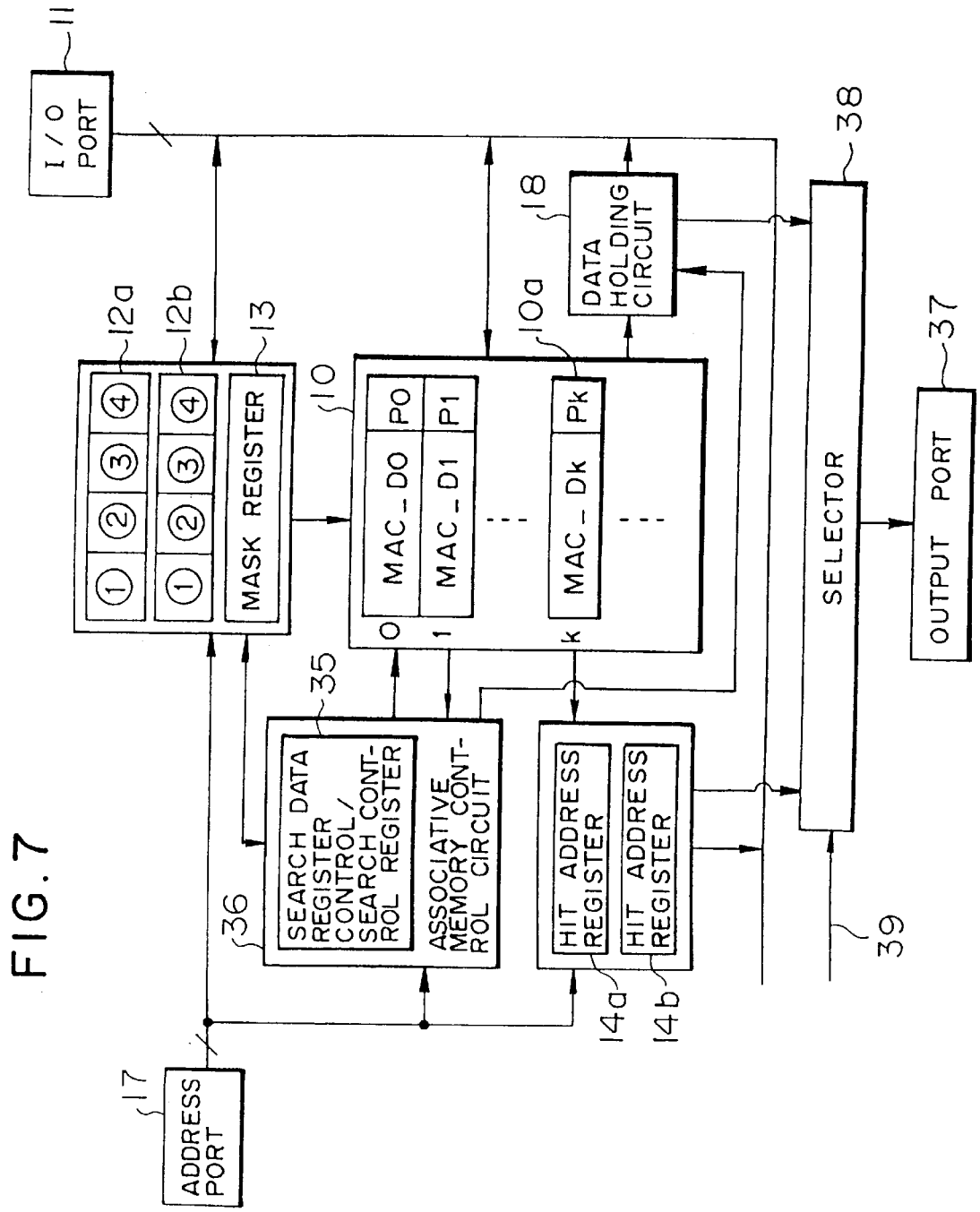
FIG. 7 is a block diagram showing an associative memory device according to another embodiment of the present invention.

An associative memory device shown in FIG. 7 is to solve this problem.

The associative memory device shown in FIG. 7 is an associative memory according to the third embodiment of the present invention. The associative memory device shown in FIG. 7 is different from the associative memory device shown in FIG. 3 in that two HHA registers A14a and B14b are arranged. These HHA registers A14a and B14b store the hit address of the memory word 10a in which MAC address data coinciding with search data of search data registers A12a and B12b is stored.

More specifically, when a search for each memory word 10a is performed by using the search data of the search data register A12a, the address of the memory word 10a, in which MAC address data coinciding with the search data is stored, is stored in the HHA register A14a as a hit address. When search for each memory word 10a is performed by using the search data of the search data register B12b, the address of the memory word 10a, in which MAC address data coinciding with the search data is stored, is stored in the HHA register B14b as a hit address.

Although not shown, two hit flag registers each of which holds a hit flag, i.e., information representing whether a memory word 10a, in which MAC address data coinciding with search data of the search data register A12a or B12b is stored, is present (hit) or not after the search operation, two multi-hit flag registers, each of which holds a multi-hit flag (i.e., information representing whether a plurality of memory words 10a, in which MAC address data coinciding with the search data are stored are present (multi-hit) after the search operation), and the like, may be arranged as needed to confirm whether the memory word 10a is hit or whether the memory words 10a are multi-hit.

Figure 8:
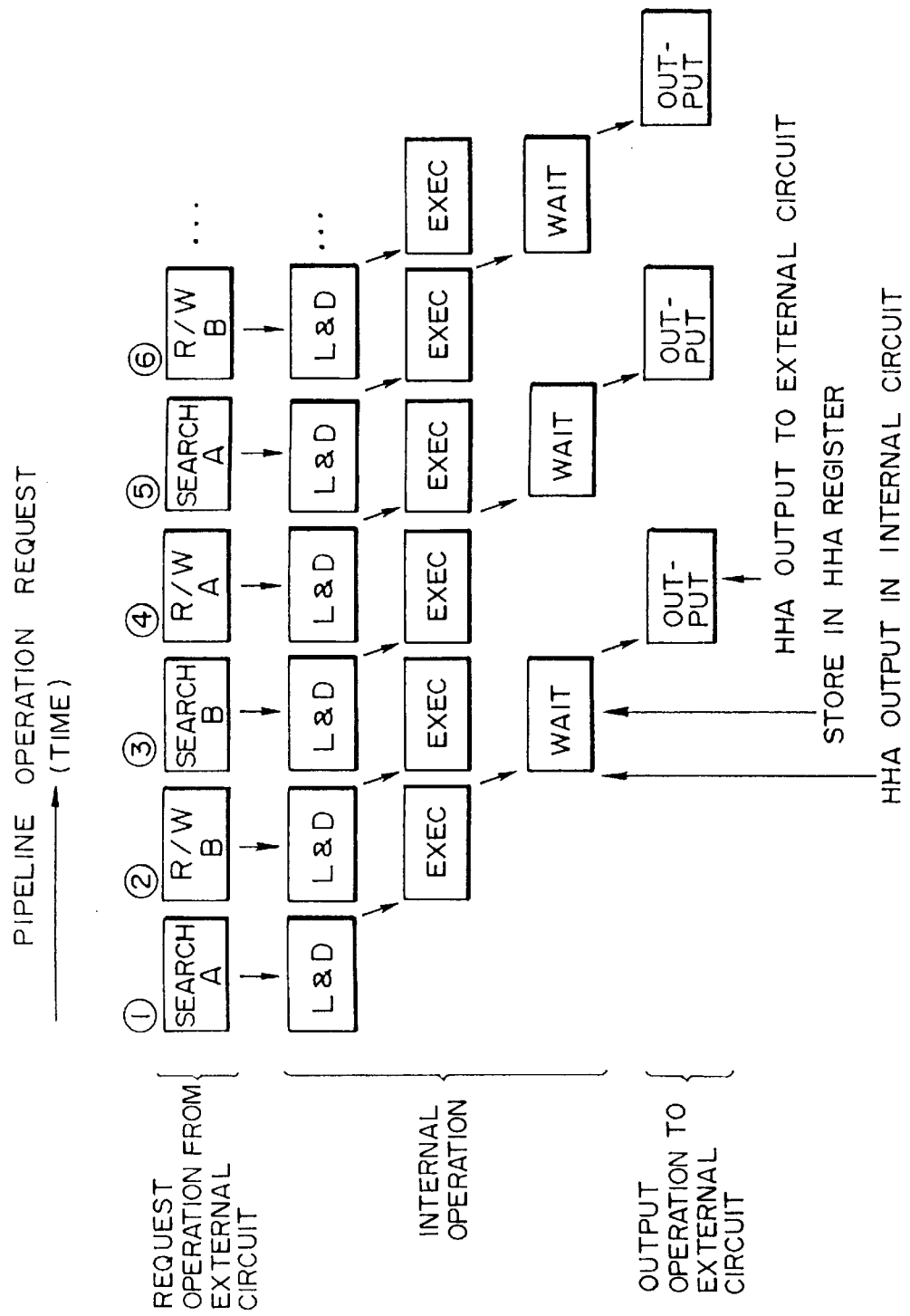
FIG. 8 is a timing chart of search data processing cycle in the associative memory device shown in FIG. 7.

Subsequently, a series of search data processing cycles in the associative memory device shown in FIG. 7 is shown in FIG. 8. Here, after the search A is performed by using the search data register A12a, writing (R/WB) of incident data is done in the memory word 10a at a hit address output by search B performed before search A. After search B is performed by using the search data register B12b, reading (R/WA) of incident data is done from the memory word 10a at a hit address output by search A performed before the search B. In this manner, writing and reading are alternately repeated.

As shown in the timing chart in FIG. 8, in the first search A, after the EXEC phase, a hit address (HHA) is output from the memory region 10 and latched by the HHA register A14a in the WAIT phase. In the second writing (R/WB) of incident data subsequent to the search A, although not shown, the hit address latched by the HHA register B14b in search B performed immediately before the search A is used in the EXEC phase, and new incident data is written in the memory word 10a at the hit address in search B immediately before the first search A.

The third search B is performed subsequent to the second writing (R/WB) of incident data, and, after the EXEC phase, a hit address (HHA) is output from the memory region 10 and latched by the HHA register B14b in the WAIT phase. In the fourth reading (R/WA) of incident data subsequent to the third search B, a hit address latched by the HHA register A14a in the first search A immediately before the third search B is used in the EXEC phase, and incident data is read from the memory word 10a at the hit address in search A.

As described above, in the associative memory device in FIG. 7, while the two HHA registers A14a,B14b are arranged after search A, incident data is written (R/WB) in the memory word 10a at a hit address in search B immediately before the search A. Similarly, after search B, the incident data can be read (R/WA) from the memory word 10a at a hit address obtained in search A, immediately before the search B. In this manner, a series of search operations can be performed without inserting an idle state period between search and read/write of incident data, and the use efficiency of the associative memory device can be improved. In the embodiment in FIG. 8, a series of operations are completed by performing the first to fourth operations. On the other hand, referring to FIG. 6, the first to sixth operations must be performed.

As has been described above, according to the present invention, an increase in the number of external interface pins is suppressed for designing simplistic conventional peripheral control circuits and a reduction in cost. The processing procedure of communication data and the characteristics of an associative memory device of this type are considered, and innovations are performed with respect to the four following points. In this manner, the processing speed of the series of search data can be improved.

1) Two search data registers are arranged, while one search data register performs a search operation which requires relatively many cycles, the next search data is partially input to the other search data register. These registers are alternately controlled to decrease the series of search data processing cycles in number.

2) A reading operation of data from a memory region and accessing of another register (HHA register) are simultaneously performed, the data is temporarily held in an internal holding circuit, and data is read from the internal holding circuit in the next short cycle, so that the processing speed is increased.

3) An I/O port is not simply extended as in an device obtained by improving the speed of a conventional device, elements which prevent a high-speed operation are analyzed, and a 16-bit output port is arranged. In this manner, a speed, which is twice that of the conventional device, is achieved, while an increase of external interface pins in number is suppressed, as opposed to the increase of external interface pins in number of the improved conventional device.

4) Two other HHA registers are arranged. When one of these registers is used for search, incident data is written in a memory word at a hit address latched by the other register in search performed immediately before the pervious search. These operations are alternately performed to prevent a useless idle state cycle from being generated.

With the above innovations, the associative memory device of the present invention has very high performance at a low cost, and its industrial value is large.

What is claimed is:

1. An associative memory device, comprising:
a data input port to which W-bit data is input;
an N-bit (W<N) first buffer and an M-bit (W<M) second buffer in which the W-bit data input through said input port is stored;
input control means for storing the W-bit data in said first or second buffer, wherein the W-bit data is input to said first buffer k times (k×W≦N) or to said second buffer r times (r×W≦M);
detection means for detecting a search operation start; and
search control means for performing a search operation for a memory region of an associative memory by using the W-bit data input through said input port in response to a detection signal from said detection means,
wherein during the search operation to the memory region of said associative memory, the W-bit data for a next search operation is input to said second or first buffer.

2. An associative memory device according to claim 1, wherein a cycle time Ts of the search operation and a cycle time Tw for writing data to said first or second buffer satisfy Tw<Ts.

3. An associative memory device according to claim 1, wherein a read cycle time Tr of data from the memory region of said associative memory is longer than the cycle time Tw (Tw<Tr), said associative memory device has holding means (DH) for temporarily holding data read from said memory region, and a read cycle Th of data from said holding means (DH) is shorter than the cycle time Tr (Th<Tr).

4. An associative memory device according to claim 3, wherein said associative memory device has automatic holding control means for automatically holding a part of a memory word hit in a search operation in said holding means (DH) when a search operation for the memory region of said associative memory is arranged.

5. An associative memory device according to claim 1, wherein said associative memory device has an output port for outputting an address of the hit word in the memory region of said associative memory device obtained by the search operation and at least a part of contents of the hit word.

6. An associative memory device according to claim 2, wherein said associative memory device has an output port for outputting an address of the hit word in the memory region of said associative memory device obtained by the search operation and at least a part of contents of the hit word.

7. An associative memory device according to claim 3, wherein said associative memory device has an output port for outputting an address of the hit word in the memory region of said associative memory device obtained by the search operation and at least a part of contents of the hit word.

8. An associative memory device according to claim 4, wherein said associative memory device has an output port for outputting an address of the hit word in the memory region of said associative memory device obtained by the search operation and at least a part of contents of the hit word.

9. An associative memory device according to claim 1, wherein said associative memory device has first and second hit address registers in which addresses of memory words in which data coinciding with the data in said first or second buffer are stored, and, by using data in said first or second buffer, during the search operation to the memory region of said associative memory, data is written in at least a part of a memory word at an address stored in said second or first hit address register.

10. An associative memory device according to claim 2, wherein said associative memory device has first and second hit address registers in which addresses of memory words in which data coinciding with the data in said first or second buffer are stored, and, by using data in said first or second buffer, during the search operation to the memory region of said associative memory, data is written in at least a part of a memory word at an address stored in said second or first hit address register.

11. An associative memory device according to claim 3, wherein said associative memory device has first and second hit address registers in which addresses of memory words in which data coinciding with the data in said first or second buffer are stored, and, by using data in said first or second buffer, during the search operation to the memory region of said associative memory, data is written in at least a part of a memory word at an address stored in said second or first hit address register.

12. An associative memory device according to claim 4, wherein said associative memory device has first and second hit address registers in which addresses of memory words in which data coinciding with the data in said first or second buffer are stored, and, by using data in said first or second buffer, during the search operation to the memory region of said associative memory, data is written in at least a part of a memory word at an address stored in said second or first hit address register.

13. An associative memory device according to claim 5, wherein said associative memory device has first and second hit address registers in which addresses of memory words in which data coinciding with the data in said first or second buffer are stored, and, by using data in said first or second buffer, during the search operation to the memory region of said associative memory, data is written in at least a part of a memory word at an address stored in said second or first hit address register.

* * * * *